United States Patent
Cirkic et al.

(10) Patent No.: US 10,735,140 B2
(45) Date of Patent: Aug. 4, 2020

(54) ENCODING AND DECODING USING A POLAR CODE

(71) Applicant: Telefonaktiebolaget LM Ericsson (publ), Stockholm (SE)

(72) Inventors: Mirsad Cirkic, Linköping (SE); Jonas Fröberg Olsson, Ljungsbro (SE); Martin Hessler, Linköping (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/096,438

(22) PCT Filed: Apr. 29, 2016

(86) PCT No.: PCT/SE2016/050381
§ 371 (c)(1),
(2) Date: Oct. 25, 2018

(87) PCT Pub. No.: WO2017/188873
PCT Pub. Date: Nov. 2, 2017

(65) Prior Publication Data
US 2019/0149267 A1    May 16, 2019

(51) Int. Cl.
*H03M 13/00* (2006.01)
*H04L 1/00* (2006.01)
(Continued)

(52) U.S. Cl.
CPC ........ *H04L 1/0063* (2013.01); *H03M 13/098* (2013.01); *H03M 13/13* (2013.01);
(Continued)

(58) Field of Classification Search
CPC .. H04L 1/0063; H04L 1/0057; H03M 13/098; H03M 13/13
See application file for complete search history.

(56) References Cited

U.S. PATENT DOCUMENTS 6,081,919 A * 6/2000 Fujiwara ............... H03M 13/29
                                                        714/755
6,721,357 B1 * 4/2004 Zhang ................. H04L 25/4927
                                                        375/222
(Continued)

FOREIGN PATENT DOCUMENTS

CN          105227189 A      1/2016
EP            2922227 A1     9/2015

OTHER PUBLICATIONS

Niu, Kai, et al., "New Repetition Polar Code over Double Blocks for the BEC Channel", Key Laboratory of Universal Wireless Communications, Ministry of Education, Beijing University of Posts and Telecommunications, Beijing 100876 China, Nov. 11, 2012, pp. 1-4.
(Continued)

*Primary Examiner* — Esaw T Abraham
(74) *Attorney, Agent, or Firm* — Murphy, Bilak & Homiller, PLLC

(57) ABSTRACT

There is provided mechanisms for encoding an information sequence into an encoded sequence. A method is performed by an information encoder. The method comprises obtaining the information sequence. The method comprises inserting at least one checkpoint sequence in the information sequence. The method comprises encoding the information sequence comprising the at least one checkpoint sequence into the encoded sequence using a polar code. There is also provided a method for decoding such an encoded sequence.

26 Claims, 7 Drawing Sheets

(51) Int. Cl.
*H03M 13/13* (2006.01)
*H03M 13/09* (2006.01)
*H04W 80/02* (2009.01)

(52) U.S. Cl.
CPC ........... *H04L 1/0057* (2013.01); *H04W 80/02* (2013.01); *H03M 13/09* (2013.01)

(56) References Cited

U.S. PATENT DOCUMENTS

| | | | | |
|---|---|---|---|---|
| 7,702,986 | B2* | 4/2010 | Bjerke | H03M 13/11 341/143 |
| 7,934,146 | B2* | 4/2011 | Stolpman | H03M 13/6527 714/800 |
| 8,756,042 | B2* | 6/2014 | Tan | G01V 1/282 703/10 |
| 9,503,126 | B2* | 11/2016 | Vardy | H03M 13/13 |
| 10,243,592 | B2* | 3/2019 | Li | H04L 1/0057 |
| 10,312,947 | B2* | 6/2019 | Ge | H03M 13/3972 |
| 10,476,634 | B2* | 11/2019 | Ge | H03M 13/151 |

OTHER PUBLICATIONS

Seidl, Mathis, et al., "Improving Successive Cancellation Decoding of Polar Codes by Usage of Inner Block Codes", 2010 6th International Symposium of Turbo Codes & Iterative Information Processing, Sep. 6, 2010, pp. 1-4.

Trifonov, Peter, "Efficient Design and Decoding of Polar Codes", IEEE Transactions on Communications, vol. 60, No. 11, Nov. 11, 2012, pp. 1-7.

Arikan, Erdal., "Channel polarization: A method for constructing capacity-achieving codes for symmetric binary-input memoryless channels", IEEE Transactions on Information Theory, vol. 55, Jul. 2009, 3051-3073.

Guo, Jianfeng, et al., "Multi-CRC Polar Codes and Their Applications", IEEE Communications Letters, vol. 20, No. 2, Feb. 2016, 212-215.

Hashemi, Seyyed Ali., "Partitioned Successive-Cancellation List Decoding of Polar Codes", 2016 IEEE International Conference on Acoustics, Speech and Signal Processing (ICASSP), Mar. 2016, 957-960.

Tal, Ido, et al., "List Decoding of Polar Codes", IEEE Transactions on Information Theory, vol. 61, No. 5, May 2015, 2213-2226.

* cited by examiner

ENCODING AND DECODING USING A POLAR CODE

TECHNICAL FIELD

Embodiments presented herein to methods, an information encoder, a computer program, and a computer program product for encoding an information sequence into an encoded sequence. Further embodiments presented herein to methods, an information decoder, a computer program, and a computer program product for decoding an encoded sequence into an information sequence.

BACKGROUND

In communications networks, there may be a challenge to obtain good performance and capacity for a given communications protocol, its parameters and the physical environment in which the communications network is deployed.

For example, in digital communication the data to be communicated from a sender to a receiver can be divided into smaller data segments which are sent in packets. These data segments are provided with information of how the data protocol used for transferring the data from the sender to the receiver should map the packets and, in some cases, analyze if the data content of the packet is correct or not. This information can typically be predicted or known by the receiver. For example when using the Internet Protocol (IP), IP-packet headers are needed for each device along the way from the sender to the receiver to route the packet. In some communications networks, such as in Long Term Evolution (LTE) radio access networks, a served wireless device will typically never receive an IP-packet with the wrong IP-address (which is exploited by so-called header-compression).

Polar codes, as presented in "Channel polarization: A method for constructing capacity-achieving codes for symmetric binary-input memoryless channels," IEEE Trans. Inform. Theory, vol. 55, pp. 3051-3073, 2009, are capacity achieving codes, have an explicit construction (i.e., not randomly generated), and have an efficient encoding and decoding algorithm. Apart from the capacity achieving property, which is valid when code-lengths tend to infinity, they have shown good performance for shorter code-lengths.

One issue with existing mechanisms for decoding polar codes lies in the successive decoding (SD) procedure which follows the bit-order of the polar codes. Decoding of polar codes is prone to error propagation and hence, an error made early in the successive decoding procedure will not be corrected, but will instead propagate all the way to the end of the decoding. This will result in a decoding error. Additionally it is more likely to make an error early in the procedure than at the end, see FIG. 2. FIG. 2 shows an example of the amount of information for a bit with index i (for i=1, 2, ... N where N is the total number of bits, and N=1024 in the example) can carry, given that all the previous bits 1, 2, ..., i−1 are known, i.e., where the polar code decoding order is followed.

According to prior art, such as in "List decoding of polar codes," IEEE International Symposium on Information Theory Proceedings (ISIT), Jul. 31, 2011-Aug. 5, 2011, this problem is mitigated by expanding a fixed list of bits (indices) that are most likely to be erroneous, i.e., bits which by the decoder are difficult to determine whether they are 0 or 1. Such techniques are commonly referred to as list-decoding. However, the list of any list-decoding procedure will grow very quickly. Large lists are advantageous for decoding performance but are disadvantages in terms of overhead and energy consumption.

Hence, there is still a need for improved mechanisms for encoding and decoding using polar codes.

SUMMARY

An object of embodiments herein is to provide efficient encoding and decoding of polar codes.

According to a first aspect there is presented a method for encoding an information sequence into an encoded sequence. The method is performed by an information encoder. The method comprises obtaining the information sequence. The method comprises inserting at least one checkpoint sequence in the information sequence. The method comprises encoding the information sequence comprising the at least one checkpoint sequence into the encoded sequence using a polar code.

According to a second aspect there is presented an information encoder for encoding an information sequence into an encoded sequence. The information encoder comprises processing circuitry. The processing circuitry is configured to cause the information encoder to obtain the information sequence. The processing circuitry is configured to cause the information encoder to insert at least one checkpoint sequence in the information sequence. The processing circuitry is configured to cause the information encoder to encode the information sequence comprising the at least one checkpoint sequence into the encoded sequence using a polar code.

According to a third aspect there is presented an information encoder for encoding an information sequence into an encoded sequence. The information encoder comprises processing circuitry and a computer program product. The computer program product stores instructions that, when executed by the processing circuitry, causes the information encoder to perform steps, or operations. The steps, or operations, cause the information encoder to obtain the information sequence. The steps, or operations, cause the information encoder to insert at least one checkpoint sequence in the information sequence. The steps, or operations, cause the information encoder to encode the information sequence comprising the at least one checkpoint sequence into the encoded sequence using a polar code.

According to a fourth aspect there is presented an information encoder for encoding an information sequence into an encoded sequence. The information encoder comprises an obtain module configured to obtain the information sequence. The information encoder comprises an insert module configured to insert at least one checkpoint sequence in the information sequence. The information encoder comprises an encode module configured to encode the information sequence comprising the at least one checkpoint sequence into the encoded sequence using a polar code.

According to a fifth aspect there is presented a computer program for encoding an information sequence into an encoded sequence, the computer program comprising computer program code which, when run on processing circuitry of an information encoder, causes the information encoder to perform a method according to the first aspect.

According to a sixth aspect there is presented a method for decoding an encoded sequence into an information sequence. The method is performed by an information decoder. The method comprises obtaining the encoded sequence. The encoded sequence has been encoded using a polar code and comprises at least one checkpoint sequence. The method comprises decoding the encoded sequence to obtain the information sequence. The method comprises decoding the encoded sequence by performing list decoding of the encoded sequence using the at least one checkpoint sequence, the list decoding of the encoded sequence resulting in at least two candidate decoded sequence. The method comprises decoding the encoded sequence by discarding those of the at least two candidate decoded sequences whose list decoding of the at least one checkpoint sequence fails.

According to a seventh aspect there is presented an information decoder for decoding an encoded sequence into an information sequence. The information decoder comprises processing circuitry. The processing circuitry is configured to cause the information decoder to obtain the encoded sequence. The encoded sequence has been encoded using a polar code and comprises at least one checkpoint sequence. The processing circuitry is configured to cause the information decoder to decode the encoded sequence to obtain the information sequence. The processing circuitry is configured to cause the information decoder to decode the encoded sequence by performing list decoding of the encoded sequence using the at least one checkpoint sequence, the list decoding of the encoded sequence resulting in at least two candidate decoded sequences. The processing circuitry is configured to cause the information decoder to decode the encoded sequence by discarding those of the at least two candidate decoded sequences whose list decoding of the at least one checkpoint sequence fails.

According to an eighth aspect there is presented an information decoder for decoding an encoded sequence into an information sequence. the information decoder comprises processing circuitry and a computer program product. The computer program product stores instructions that, when executed by the processing circuitry, causes the information decoder to perform steps, or operations. The steps, or operations, cause the information decoder to obtain the encoded sequence. The encoded sequence has been encoded using a polar code and comprises at least one checkpoint sequence. The steps, or operations, cause the information decoder to decode the encoded sequence to obtain the information sequence. The steps, or operations, cause the information decoder to decode the encoded sequence by performing list decoding of the encoded sequence using the at least one checkpoint sequence, the list decoding of the encoded sequence resulting in at least two candidate decoded sequences. The steps, or operations, cause the information decoder to decode the encoded sequence by discarding those of the at least two candidate decoded sequences whose list decoding of the at least one checkpoint sequence fails.

According to a ninth aspect there is presented an information decoder for decoding an encoded sequence into an information sequence. The information decoder comprises an obtain module configured to obtain the encoded sequence. The encoded sequence has been encoded using a polar code and comprises at least one checkpoint sequence. The information decoder comprises a decode module configured to decode the encoded sequence to obtain the information sequence. The information decoder comprises a list decode module being configured to perform list decoding of the encoded sequence using the at least one checkpoint sequence, the list decoding of the encoded sequence resulting in at least two candidate decoded sequences. The information decoder comprises a discard module being configured to discard those of the at least two candidate decoded sequences whose list decoding of the at least one checkpoint sequence fails.

According to a tenth aspect there is presented a computer program for decoding an encoded sequence into an information sequence, the computer program comprising computer program code which, when run on processing circuitry of an information decoder, causes the information decoder to perform a method according to the sixth aspect.

According to an eleventh aspect there is presented a computer program product comprising a computer program according to at least one of the fifth aspect and the tenth aspect and a computer readable storage medium on which the computer program is stored. The computer readable storage medium can be a non-transitory computer readable storage medium.

Advantageously these methods, these information encoders, these information decoders, and these computer programs provide efficient encoding and decoding for polar codes.

Advantageously these methods, these information encoders, these information decoders, and these computer programs provide efficient management of list decoding of an information sequence having been encoded using a polar code. This implies efficient performance and/or lower computational overhead in the information decoder from that short lists are possible.

It is to be noted that any feature of the first, second, third, fourth, fifth, sixth seventh, eight, ninth, tenth and eleventh aspects may be applied to any other aspect, wherever appropriate. Likewise, any advantage of the first aspect may equally apply to the second, third, fourth, fifth, sixth, seventh, eight, ninth, tenth, and/or eleventh aspect, respectively, and vice versa. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

Figure 1:
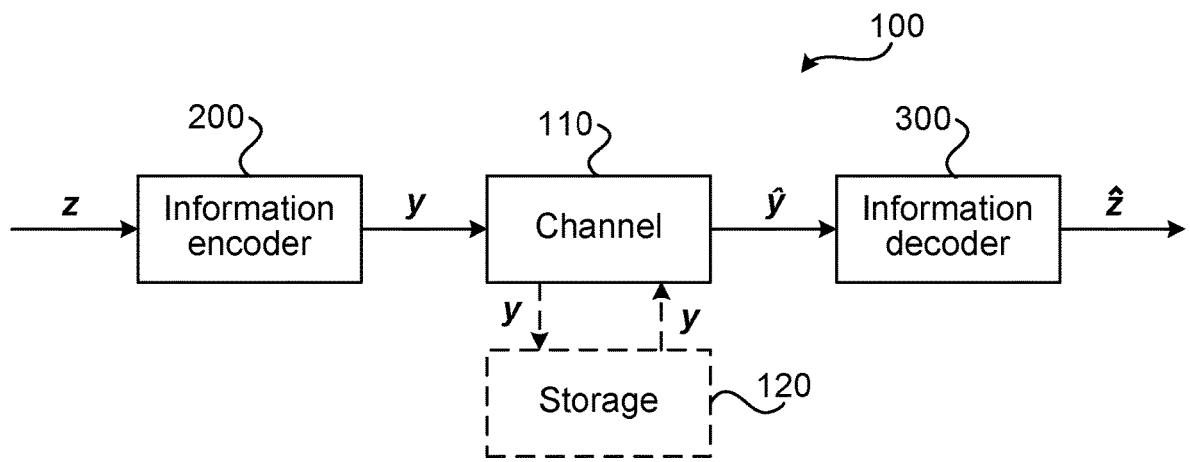
FIG. 1 is a schematic diagram illustrating a communication network according to an embodiment.
Figure 2:
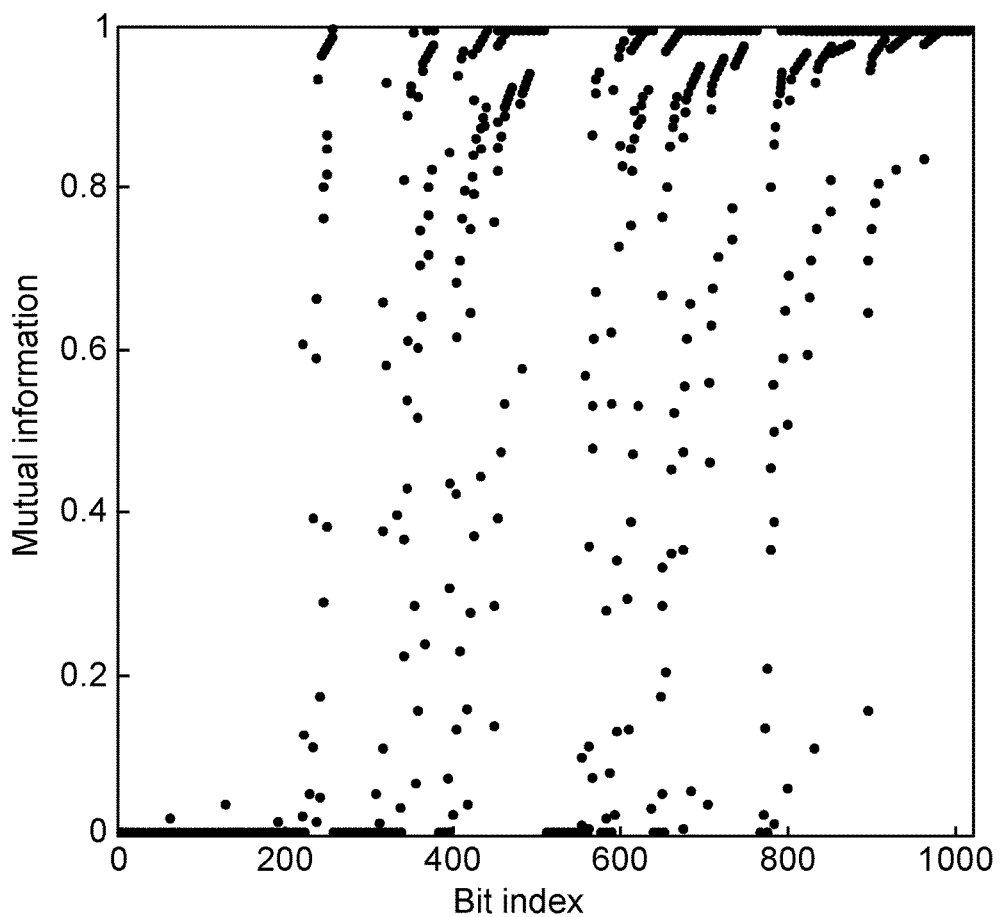
FIG. 2 is a schematic diagram illustrating mutual information according to an embodiment.

FIG. 1 is a schematic diagram illustrating a communications network 100 where embodiments presented herein can be applied. The communications network 100 comprises an information encoder 200 and an information decoder 300. The information encoder 200 is configured to encode an information sequence z into an encoded sequence y. The information decoder 300 is configured to decode an encoded sequence ŷ into an information sequence ẑ.

The information encoder 200 and the information decoder 300 are separated by a symbolic communications channel 11o. The communications channel 110 models how the encoded sequence y is affected between the information encoder 200 and the information decoder 300. For example, the transmission of the encoded sequence y may cause errors to be inserted in the encoded sequence y. Here, and error is to be interpreted as a bit-value in the encoded sequence y being flipped from a binary zero to a binary one, or vice versa, during transmission over the communications channel 110. Therefore the encoded sequence y as obtained by the information decoder 300 is denoted ŷ, where ŷ=y if the channel is error-free and ŷ≠y elsewhere. Further, if ŷ=y then also ẑ=z, but if ŷ≠y there is a non-zero probability that ẑ≠z. In order to minimize the probability that ẑ≠z the information encoder 200 during the encoding procedure adds redundancy to the information sequence z in a controlled manner, resulting in the encoded sequence y. The redundancy is added in the controlled manner by using a polar code. Conversely, at the information decoder 300 the added redundancy is removed from the received encoded sequence ŷ in a controlled manner, resulting in the decoded information sequence ẑ. Further, the communications network 100 comprises a (optional) data storage 120. The data storage 120 is assumed to store data losslessly, i.e., without introducing losses in the stored data. Any losses in the data are modelled by the communications channel 110.

It is assumed that the information encoder 200 and the information decoder are based on polar codes. As disclosed above, list-decoding can be used in order to determine decoded information sequence ẑ. Prior art techniques of list-decoding of polar codes are based on probability measures to decide which candidates decoded sequence should be considered and hence stored in the list. These probability measures are not reliable since they contain errors due to approximations (i.e., they contain estimation errors).

Embodiments disclosed herein therefore relate to mechanisms for encoding an information sequence z into an encoded sequence y. In order to obtain such mechanisms there is provided an information encoder 200, a method performed by the information encoder 200, a computer program product comprising code, for example in the form of a computer program, that when run on processing circuitry of the information encoder 200, causes the information encoder 200 to perform the method.

Further embodiments disclosed herein thus relate to mechanisms for decoding an encoded sequence ŷ into an information sequence ẑ. In order to obtain such mechanisms there is further provided an information decoder 300, a method performed by the information decoder 300, and a computer program product comprising code, for example in the form of a computer program, that when run on processing circuitry of the information decoder 300, causes the information decoder 300 to perform the method.

Figure 3:
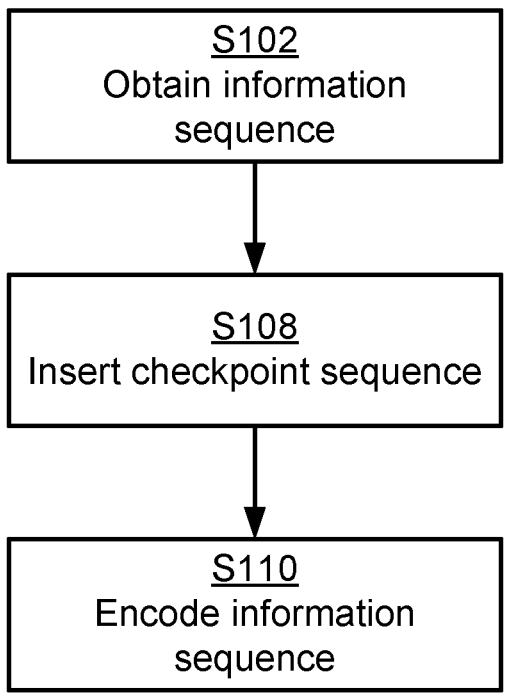
FIGS. 3, 4, 5, and 6 are flowcharts of methods according to embodiments.
Figure 4:
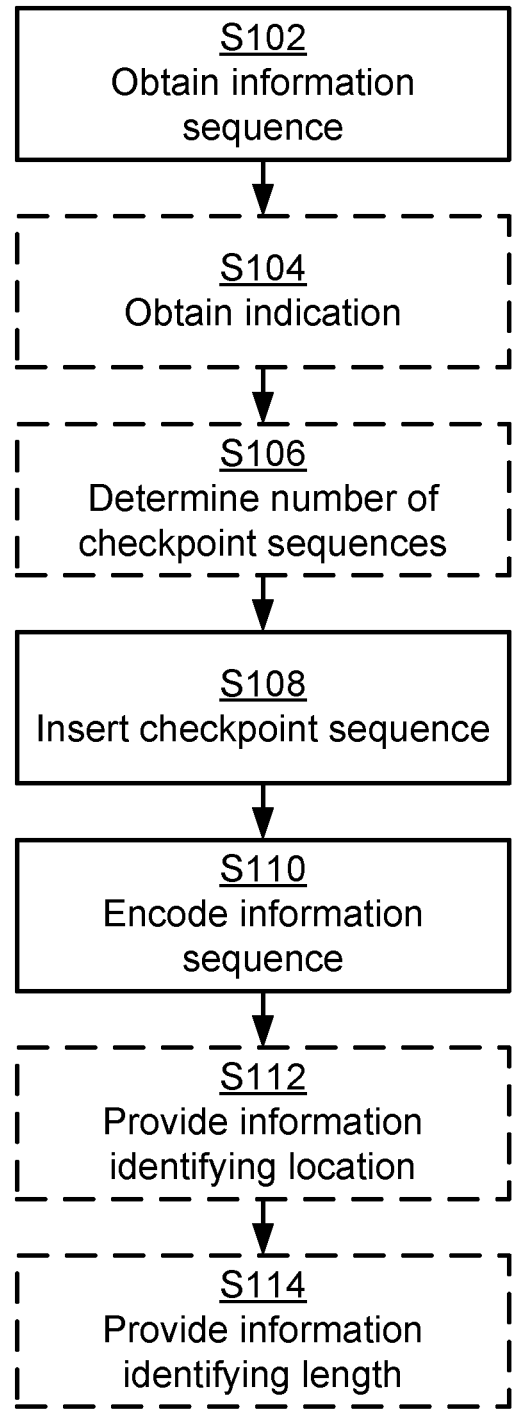
Figure 5:
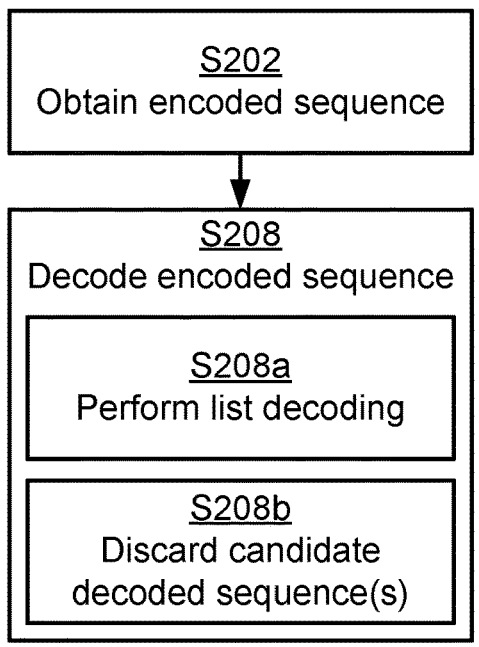
Figure 6:
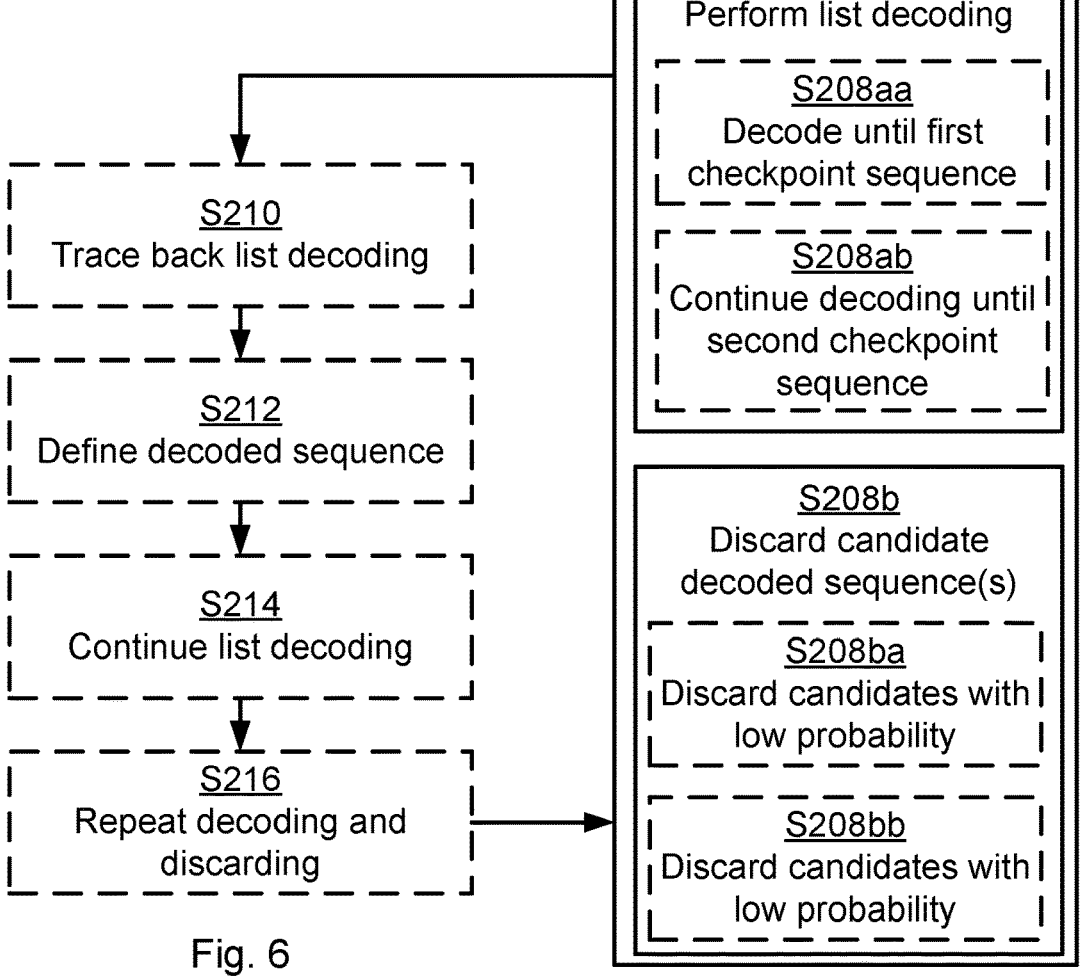

FIGS. 3 and 4 are flow charts illustrating embodiments of methods for encoding an information sequence z into an encoded sequence y as performed by the information encoder 200. FIGS. 5 and 6 are flow charts illustrating embodiments of methods for decoding an encoded sequence ŷ into an information sequence ẑ as performed by the information decoder 300. The methods are advantageously provided as computer programs.

At least some of the herein disclosed embodiments are based on mapping data bits to the bit-order as given by the polar code such that known or partially known bit-sequences (hereinafter denoted checkpoint sequences) in the information sequence z are placed to enable the information decoder 300 to detect decoding errors relatively early in the decoding procedure. Such an early detection of decoding errors can be used to truncate a list of possible candidate decoded sequences when using list decoding of the encoded sequence, but it can also be used to decide whether a partial decoding needs to be redone using a new list of candidate decoded sequences if all candidate decoded sequences in the current list fail the checkpoint.

Reference is now made to FIG. 3 illustrating a method for encoding an information sequence z into an encoded sequence y as performed by the information encoder 200 according to an embodiment. The information encoder 200 is configured to obtain the information sequence z and hence is configured to perform step S102:

S102: The information encoder 200 obtains the information sequence z.

The encoding is based on defining a set of checkpoint sequences (where the set of checkpoint sequences could consist of a single checkpoint sequence or at least two checkpoint sequences) in the information sequence z to be encoded using a polar code. Hence, the information encoder 200 is configured to perform step S108:

S108: The information encoder 200 inserts at least one checkpoint sequence in the information sequence z. Each checkpoint sequence is defined by a set of bits (where the set of bits could consist of a single bit or at least two bits). The information encoder 200 then encodes the the information sequence z (into the encoded sequence y) using a polar code. Hence, the information encoder 200 is configured to perform step S110:

S110: The information encoder 200 encodes the information sequence z comprising the at least one checkpoint sequence into the thus encoded sequence y using a polar code.

Thus, the checkpoint bits are assumed to be information bits (e.g. not fixed-bits in the polar code). In general words, the checkpoint bits are alterable by the information encoder 200 and thus not fixed in the code-design, even though these checkpoint bits will not convey information.

Although these checkpoint bits could be fixed according to the information-theoretic-optimal polar-code rule, and that doing that would increase the probability of correcting the erroneous bits, this will not provide any information to the information decoder 300 whether the so far decoded bits are correct or not. This is a fundamental difference between assigning bits to a checkpoint sequence and to a fixed value in the code-design.

Reference is now made to FIG. 4 illustrating methods for encoding an information sequence z into an encoded sequence y as performed by the information encoder 200 according to further embodiments. It is assumed that steps S102, S108, and S110 are performed as described with reference to FIG. 3, and a repeated description of these steps is therefore omitted.

The positions of the checkpoint sequences (referred to as the checkpoint positions) in the information sequence z need to be known at both the information encoder 200 and the information decoder 300. There may be different ways for the information encoder 200 to define the checkpoint positions and to enable the information decoder 300 to identify the checkpoint positions. Different embodiments relating thereto will now be described in turn.

According to aspects the information encoder 200 determines the checkpoint positions and indicates the checkpoint positions to the information decoder 300 using control information. Hence, according to an embodiment the information encoder 200 is configured to perform step S112:

S112: The information encoder 200 provides information identifying a location of the at least one checkpoint sequence in the information sequence z. The information encoder 200 could further be configured to signal the number of checkpoint sequences to the information decoder 300. This would relieve the information decoder 300 from being configured to handle extension bit errors is in the context of checkpoint sequences.

According to further aspects the information encoder 200 indicates the length of the checkpoint sequence(s) to the information decoder 300 using control information. Hence, according to an embodiment the information encoder 200 is configured to perform step S114:

S114: The information encoder 200 provides information identifying the length of the at least one checkpoint sequence.

As will be further disclosed below the information encoder 300 can determine the location of the checkpoint sequences based on the decoder complexity (i.e., the complexity of the information decoder 300 for decoding the encoded sequence). According to an embodiment the information encoder 200 is therefore configured to perform step S104:

S104: The information encoder 200 obtains an indication of computational effort needed by the information decoder 300 for decoding the encoded sequence into the information sequence.

The information encoder 200 then determines the number of checkpoint sequences to be used based on this obtained indication, as in step S106:

S106: The information encoder 200 determines how many of the at least one checkpoint sequence to insert in the information sequence based on the indication of computational effort.

Further examples of how to define the checkpoint positions will be provided below.

Reference is now made to FIG. 5 illustrating a method for decoding an encoded sequence $\hat{y}$ into an information sequence $\hat{z}$ as performed by the information decoder 300 according to an embodiment.

S202: The information decoder 300 obtains the encoded sequence $\hat{y}$. The encoded sequence $\hat{y}$ has been encoded using a polar code and comprises at least one checkpoint sequence.

Upon having obtained the encoded sequence $\hat{y}$, the information decoder 300 decodes the encoded sequence $\hat{y}$, by being configured to perform step S208:

S208: The information decoder 300 decodes the encoded sequence $\hat{y}$ to obtain the information sequence $\hat{z}$.

The decoding comprises using list decoding wherein one or more decoding steps are performed in order to producing one or more candidate decoded sequences. Particularly, the information decoder 300 is configured to perform steps S208a and S208b in order to decode the encoded sequence $\hat{y}$ to obtain the information sequence $\hat{z}$:

S208a: The information decoder 300 performs list decoding of the encoded sequence $\hat{y}$ using the at least one checkpoint sequence. The list decoding of the encoded sequence $\hat{y}$ results in at least two candidate decoded sequences.

Step S208a is performed in order for the information decoder 300 to determine which (if any) of the at least two candidate decoded sequences to keep. The candidate decoded sequences are sequences of decoded bits. At checkpoint positions representing positions in the decoded bit sequence the information decoder 300 evaluates a checkpoint check for each of the candidate decoded sequences. The candidate decoded sequences that fail the check are removed from the list of candidate decoded sequences, as in step S208b:

S208b: The information decoder 300 discards those of the at least two candidate decoded sequences whose list decoding of the at least one checkpoint sequence fails.

Discarding the at least two candidate decoded sequences in step S208b can result in the information decoder 300 keeping one (single) candidate decoded sequence.

In the case when only one correct partial candidate decoded sequence is found, this candidate decoded sequence can be used to prune all the other partial candidate decoded sequence in the list and keeping only the correct candidate decoded sequence (thus reducing the list-size to one single list item). This will effectively mark the current checkpoint as passed.

Reference is now made to FIG. 6 illustrating methods for decoding an encoded sequence $\hat{y}$ into an information sequence $\hat{z}$ as performed by the information decoder 300 according to further embodiments. It is assumed that steps S202, S208, S208a, and S208b are performed as described with reference to FIG. 5, and a repeated description of these steps is therefore omitted.

There may be different ways for the information decoder 300 to know the location of the checkpoint sequence in the information sequence z. Different embodiments relating thereto will now be described in turn. According to an embodiment the information decoder 300 is configured to perform step S204:

S204: The information decoder 300 obtains information identifying a location of the at least one checkpoint sequence in the information sequence.

There could be different ways for the information decoder 300 to obtain the information in step S204. For example, the location of the checkpoint sequence could be explicitly obtained, for example indicated by the information encoder 200. For example, the information can be obtained by the information decoder 300 analysing the at least two candidate decoded sequences. This may require the information decoder 300 to be aware of the the structure of the data represented by the information sequence z. Further details relating to this will be disclosed below. Additionally, the information decoder 300 can be configured to obtain the length of the checkpoint sequences by performing step S206:

S206: The information decoder 300 obtains information identifying the length of the at least one checkpoint sequence. This information can by the information decoder 300 be used to determine the location of the at least one checkpoint sequence in the information sequence. Further details relating to this will be disclosed below.

There may be different ways to decode the encoded sequence in step S208a. According to an embodiment the information decoder 300 is configured to perform the list decoding in step S208a by performing step S208aa: S208aa: The information decoder 300 decodes the encoded sequence until a first of the at least one checkpoint sequence has been decoded. The decoding results in the at least two candidate decoded sequences. Each of the at least two candidate decoded sequences are associated with a probability of having correctly decoded the first checkpoint sequence.

According to this embodiment the information decoder 300 is then configured to discard the at least two candidate decoded sequences in step S208b by performing step S208ba:

S208ba: The information decoder 300 discards all of the at least two candidate decoded sequences that have a probability of having correctly decoded the first checkpoint sequence below a threshold value.

According to an embodiment there are at least two checkpoint sequences. According to an embodiment the information decoder 300 is then configured to perform the list decoding in step S208a by performing step S208ab:

S208ab: The information decoder 300 continues decoding the encoded sequence until a second of the at least two checkpoint sequences has been decoded. The decoding results in at least two further candidate decoded sequences, each associated with a further probability of having correctly decoded the second checkpoint sequence.

According to this embodiment the information decoder 300 is then configured to discard the at least two candidate decoded sequences in step S208b by performing step S208bb:

S208bb: The information decoder 300 discards all of the at least two candidate decoded sequences having a probability of having correctly decoded the second checkpoint sequence below the threshold value.

There may be different causes for the at least two candidate decoded sequences to be obtained during the list decoding in step S208a. According to an embodiment the at least two candidate decoded sequences are a result of branching the decoded sequences into the at least two candidate decoded sequences during the list decoding of the encoded sequence. There may be different causes of the branching. According to an embodiment the branching is caused by a binary digit of the decoded sequences having an equal probability of being decoded into a zero and a one during the list decoding of the encoded sequence. In this respect the term equal probability should be construed as a probability value of decoding the bit into a zero being in the range 0.35-0.65, more preferably in the range 0.4-0.6. Examples of such branching will be provided with reference to FIGS. 7 and 8.

There may be different ways to proceed the decoding in step S208 when all candidate decoded sequences are discarded in step S208a. For example, a new list can be built based on picking the runner-up candidate decoded sequences that were excluded during the building of the previous list between the previous-most passed checkpoint (and thus successfully decoded checkpoint sequence) and the current failed checkpoint. This back-tracing can be repeated until a correct candidate decoded sequences is found or until a stopping criterion has been triggered followed by a decoding error declaration. Hence, according to an embodiment, when all of the at least two candidate decoded sequences are discarded, the information decoder 300 is configured to perform steps S210, S212, and S214 in order to continue the decoding process: S210: The information decoder 300 traces back the list decoding to a most recently successfully decoded checkpoint sequence in the decoded sequence.

S212: The information decoder 300 defines as decoded sequence another of the at least two candidate decoded sequences that has been successfully decoded at this most recently successfully decoded checkpoint sequence.

S214 the information decoder 300 continues the list decoding from this most recently successfully decoded checkpoint sequence and using the decoded sequence as defined in step S212.

As mentioned above, there is at least one checkpoint sequence, but there could generally be more than one checkpoint sequences. According to an embodiment there are is plurality of checkpoint sequences. The list decoding is then repeated for all checkpoints by the information decoder 300 being configured to perform step S216:

S216: The information decoder 300 repeats the step S208a of decoding and the step S208b of discarding for all checkpoint sequences and until the complete encoded sequence has been decoded. This results in one single decoded sequence. This single decoded sequence defines the information sequence $\hat{z}$ at the information decoder 300.

Figure 7:
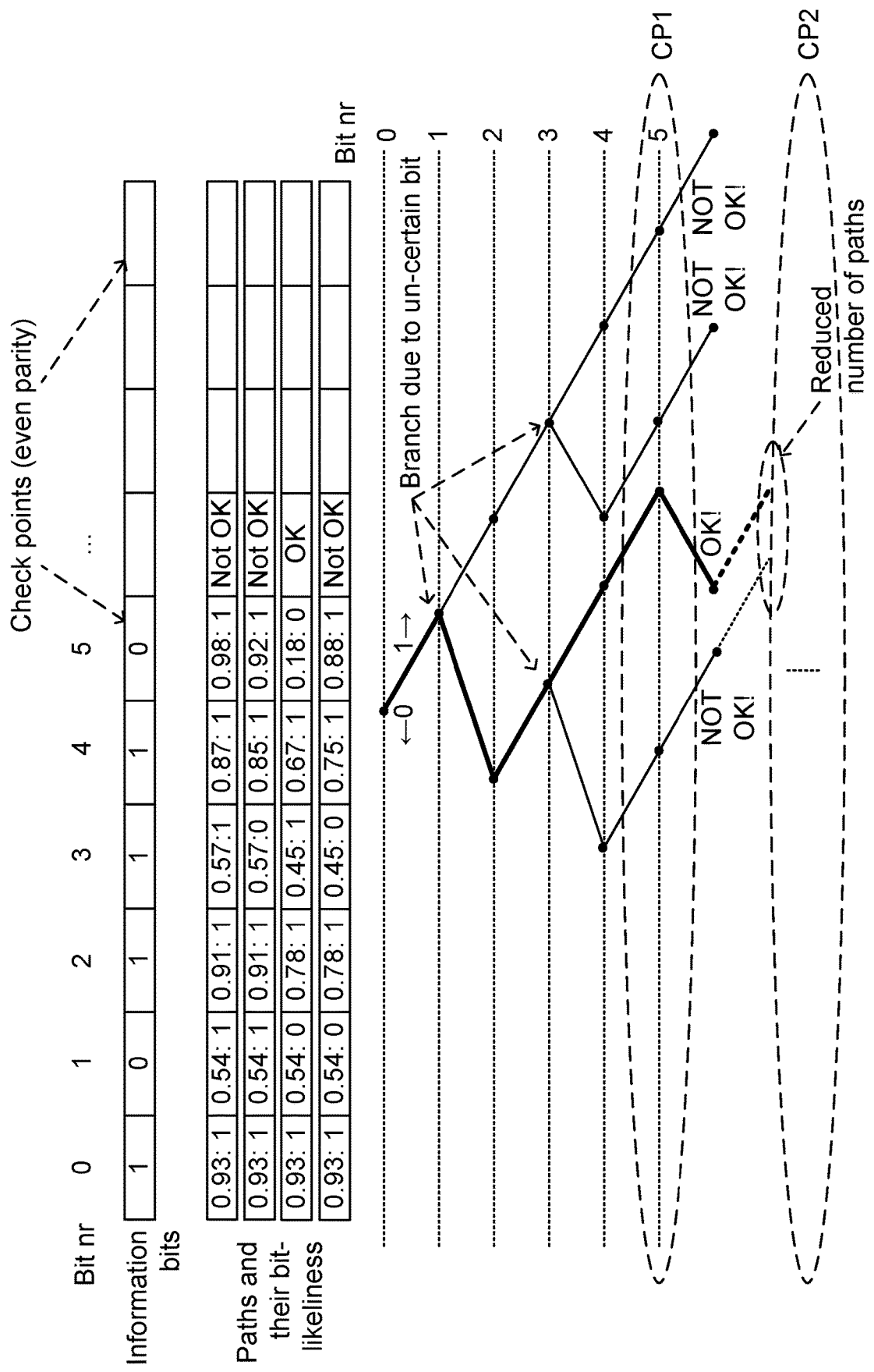
FIGS. 7 and 8 are schematic diagrams illustrating list decoding according to embodiments.

FIG. 7 illustrates an example of a checkpoint aided list decoding of a polar code with a list that has reached a size of 4 and where the first checkpoint sequence (consisting of a single parity bit) was inserted at bit 5. In this example, the probabilities show the evaluated likelihoods of each bit being equal to 1. Any bit whose probability is between 0.5±0.2 is said to be uncertain in this example and hence is branched out. This has resulted in four different paths when the first checkpoint sequence (at bit 5) is reached. In the example of FIG. 7 only the third path indicates a 0 at bit five (the probability of decoding bit 5 as a 1 is 0.18 and hence bit 5 is decoded as 0) and hence this path is selected as the candidate decoded sequence.

Figure 8:
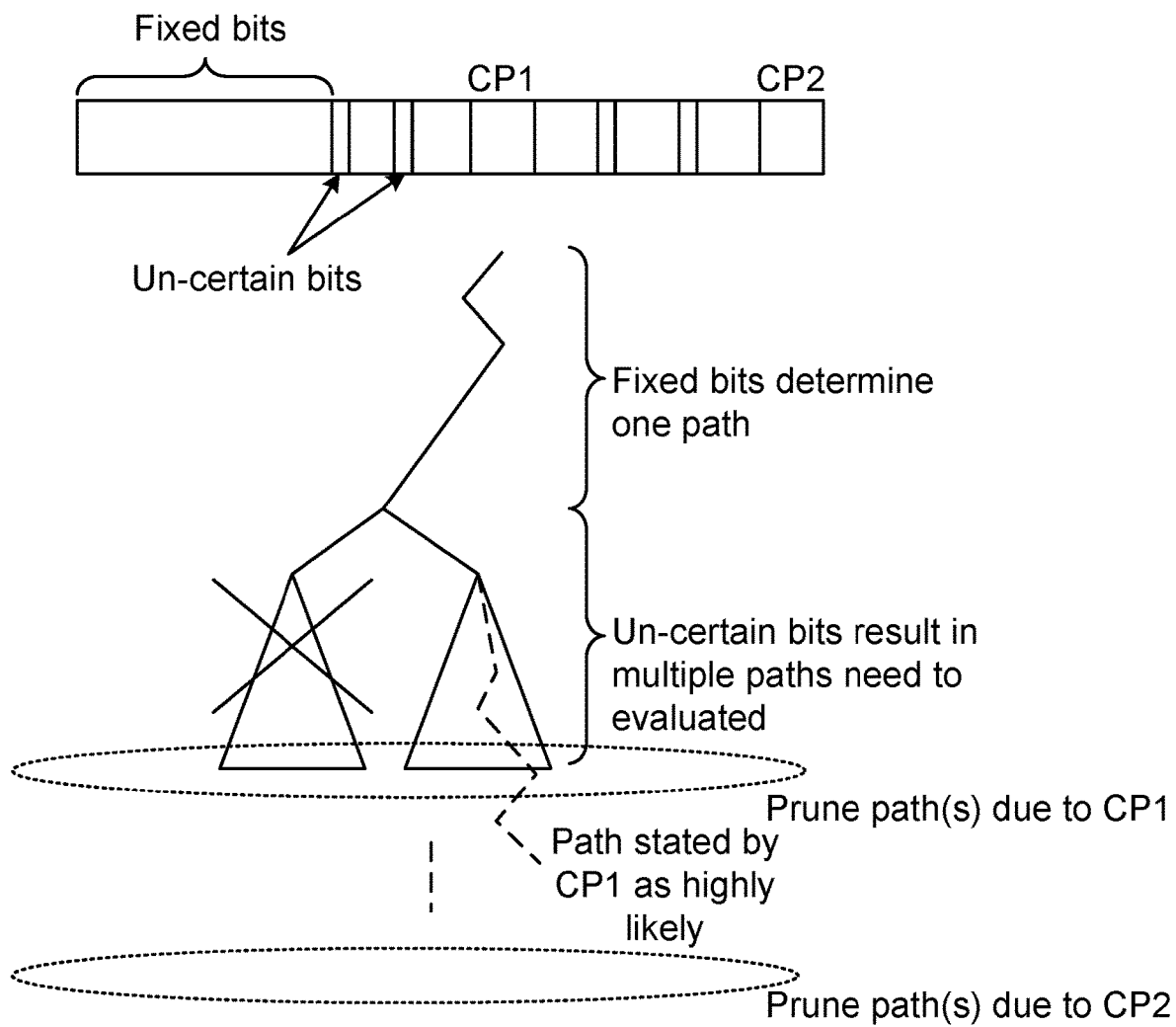

FIG. 8 shows a more general illustration of checkpoint aided list decoding of a polar code wherein a sequence of uncertain bits may result in sub-trees of candidate decoded sequences and wherein the checkpoint positions may prune a whole sub-tree (i.e., pruning a large set of candidates from the candidate decoded sequences).

According to some aspects the checkpoint positions are given by a standardization specification. A standardization specification could specify a procedure that determines the checkpoint positions. The checkpoint positions may be located at regular intervals. The checkpoint positions may further depend on the length of the information sequence. In some aspects the checkpoint sequences are therefore placed uniformly along the length of the information sequence. For example, 4 checkpoint sequences could be placed at lengths ⅕, ⅖, ⅗, and ⅘ of the total length of the information sequence. Hence, according to an embodiment where there is a plurality of checkpoint sequences, the plurality of checkpoint sequences is placed uniformly over the length of the information sequence. This strategy is robust and suitable for most implementations.

In some aspects the checkpoint sequences are placed more densely at the beginning of the information sequence than at the end of the information sequence. For example, 4 checkpoint sequences could be placed at lengths, $1/15$, $1/5$, $2/5$, $2/3$ of the total length of the information sequence. Hence, according to an embodiment the information sequence has a beginning portion and an end portion, and the plurality of checkpoint sequences are more densely placed in the beginning portion than in the end portion. If the information decoder 300 comprises a parallelized hardware processor this allows a large amount of branching to be performed in the beginning portion until all cores of the parallelized hardware processor are used and hence allow a large set of branches to be generated for the list-decoding. The herein disclosed embodiments can then be used to efficiently prune this large set of branches.

According to an embodiment the at least one checkpoint sequence is placed in the information sequence according to a predetermined scheme. For example, mechanisms could be used that know the exact implementation that the information decoder 300 uses to determine how many decoding operations needs to be performed prior to arriving at a given checkpoint and how many decoding operations will be performed after the given checkpoint. In some embodiments an analytic description of the error probabilities and list sizes is therefore obtained. For example, a Greedy principle could be used to generate which positions $N_i$ to insert the checkpoint sequences, e.g. which information bits $B_i=[b_i, \ldots, b_{i+n}]$ for $i=N_0, \ldots, N_k$ should be used for checkpoint sequences. This can be done by evaluating the complexity of decoding $C(N_0, \ldots, N_k)$. The complexity could be determined either as the expected total number of needed operations for decoding or the 99$^{th}$ percentile of the number of operations; or the expected maximum list length; or the 99$^{th}$ percentile of the list size, etc. Using this value the Greedy algorithm would add checkpoint sequences until the complexity is less than a target threshold THR according to the following pseudo-code:

While $C(N_0, \ldots, N_k) >$ THR do
    $N_{k+1} = \text{argmin}_i (C(N_0, \ldots, N_k, i))$
    increase k by 1
endwhile This implies that checkpoint bits are added such that the complexity is lowered as much as possible, without any global optimization. For example, if the information decoder 300 has access to 64 processing cores, the list size is to be less than 64.

According to further embodiments the placement of the checkpoint sequences in the information sequence z utilize the structure of the data represented by the information sequence z. For example, according to an embodiment each of the at least one checkpoint sequence is defined by a check sum of a cyclic redundancy check (CRC), an Internet Protocol (IP) address, a header, a sub-header, at least one reserved bit in a Radio Link Control Protocol Data Unit (RLC PDU), or a at least one extension bit in the Radio Link Control Protocol Data Unit. In general, any known properties of the data packets e.g. a CRC check sum, an IP-address, an RLC segment number window, reserved bits in a header, etc., can be used to build in checkpoint sequences in the information sequence z. In this way the checkpoint sequences does not require removal (or addition) of any information bits in the information sequence z but rather a mapping of known sequences, such as Media Access Control (MAC) sub-headers, in the information sequence z according to a predetermined scheme.

Figure 9:
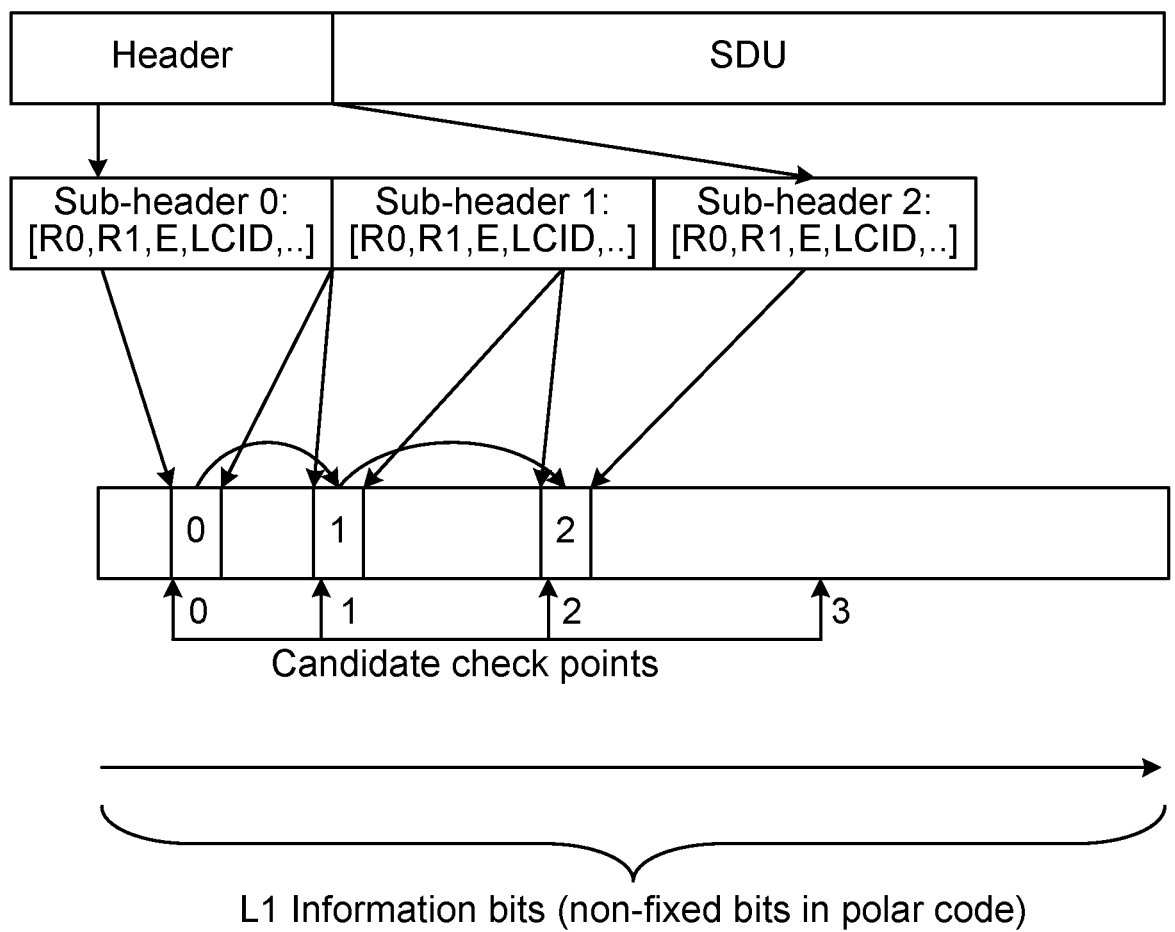
FIG. 9 is a schematic diagram illustrating a MAC SDU including its MAC header according to an embodiment.

FIG. 9 schematically illustrates a MAC service data unit (SDU) including its MAC header. The MAC header in turn consists of three sub-headers; Sub-header 0, Sub-header 1, and Sub-header 2. The sub-headers include an extension bit that indicates if there is an additional sub-header. In terms of RLC PDUs, three reserved bits and one extension bit are present in RLC sub-headers for un-acknowledged RLC while one extension bit is present for acknowledged mode RLC. Errors can then be detected during the decoding by multiplexing the sub-header (MAC or RLC) in the wanted check-point positions. Since the reserved bits (denoted R0, R1 for MAC sub-headers) of the sub-headers are known and that the logical channel identity (LCID) is partially known only a very finite set of bit-sequences are configured as valid checkpoint sequences. Further, the number of MAC sub-headers is embedded by use of an extension bit (E) that indicates if there is any further sub-header. Hence, in embodiments where there are at least two checkpoint sequences, and a first of the at least two checkpoint sequences could include a bit indicating presence of a second of the at least two checkpoint sequences in the information sequence z. By using a pre-determined scheme to distribute the sub-headers (as illustrated in FIG. 9) the sub-headers can be used as checkpoint sequences to detect direct errors and cascade errors during the decoding.

Further, although the information encoder 200 and the information decoder 300 have agreed on the locations where to put the checkpoint sequences, the number of checkpoint sequences is not known to the information decoder 300 since the information decoder 300 does not know beforehand the number of sub-headers and thus needs to decode the extension bit in order to know if there are any further sub-headers. If the extension bit is toggled from its true vale to a false vale due to impact of the transmission channel 110, further error detection could stopped. But it would still be possible for the information decoder 300 to check the next possible position of a checkpoint sequence; any next sub-header sequence will be considered as consisting of a sequence of "pseudo-random" data bits which is likely to be different from a sequence of data bits of the SDU and thus the information decoder 300 will very likely be able to detect the next sub-header sequence.

In summary, at least some of the herein disclosed embodiments enable efficient inclusion of checkpoint sequences (such as CRC-checks or MAC/RLC (sub-)headers for instance) in the information sequence z, so that the information decoder 300 with very high probability early on in the list-decoding procedure can determine which candidate decoded sequences in the list are erroneous. In the middle of the decoding procedure the information decoder 300 has only determined partial candidate decoded sequences since the full candidate decoded sequences are only acquired at the end of the list-decoding.

At a certain checkpoint, the complete data of the candidate decoded sequences used to generate the checkpoint sequence needs to be available, hence making it possible to generate the checkpoint sequence for the partial candidate decoded sequences and compare to the received checkpoint sequence. This is indeed the case since when a certain bit index is reached (that marks a checkpoint of a CRC check for instance), all the previous bits 1, ..., i−1, i have been decoded and fixed. For different partial candidate decoded sequences in the list, the bits are decoded to different values. The checkpoint will provide the information to either pick the correct partial candidate decoded sequence (if it is in the list), or to reset the procedure by emptying the list and restarting from for instance the last passed checkpoint if all partial candidate decoded sequences are erroneous. To mitigate error propagation, it can be beneficial to have the checkpoint sequences early in the information sequence z.

Figure 10:
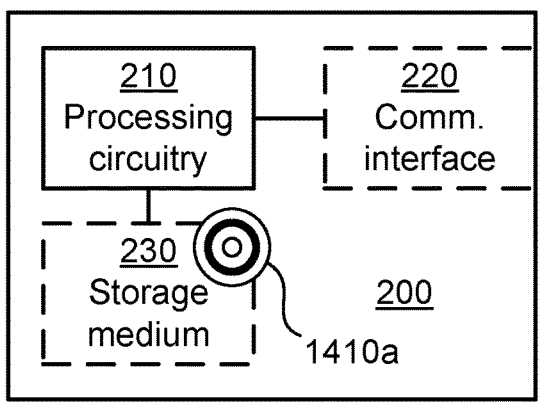
FIG. 10 is a schematic diagram showing functional units of an information encoder according to an embodiment.

FIG. 10 schematically illustrates, in terms of a number of functional units, the components of an information encoder 200 according to an embodiment. Processing circuitry 210 is provided using any combination of one or more of a suitable central processing unit (CPU), multiprocessor, microcontroller, digital signal processor (DSP), etc., capable of executing software instructions stored in a computer program product 1410a (as in FIG. 14), e.g. in the form of a storage medium 230. The processing circuitry 210 may further be provided as at least one application specific integrated circuit (ASIC), or field programmable gate array (FPGA).

Particularly, the processing circuitry 210 is configured to cause the information encoder 200 to perform a set of operations, or steps, S102-S114, as disclosed above. For example, the storage medium 230 may store the set of operations, and the processing circuitry 210 may be configured to retrieve the set of operations from the storage medium 230 to cause the information encoder 200 to perform the set of operations. The set of operations may be provided as a set of executable instructions. Thus the processing circuitry 210 is thereby arranged to execute methods as herein disclosed.

The storage medium 230 may also comprise persistent storage, which, for example, can be any single one or combination of magnetic memory, optical memory, solid state memory or even remotely mounted memory.

The information encoder 200 may further comprise a communications interface 220 for communications at least with an information decoder 300. As such the communications interface 220 may comprise one or more transmitters and receivers, comprising analogue and digital components and a suitable number of antennas for wireless communications and ports for wireline communications.

The processing circuitry 210 controls the general operation of the information encoder 200 e.g. by sending data and control signals to the communications interface 220 and the storage medium 230, by receiving data and reports from the communications interface 220, and by retrieving data and instructions from the storage medium 230. Other components, as well as the related functionality, of the information encoder 200 are omitted in order not to obscure the concepts presented herein.

Figure 11:
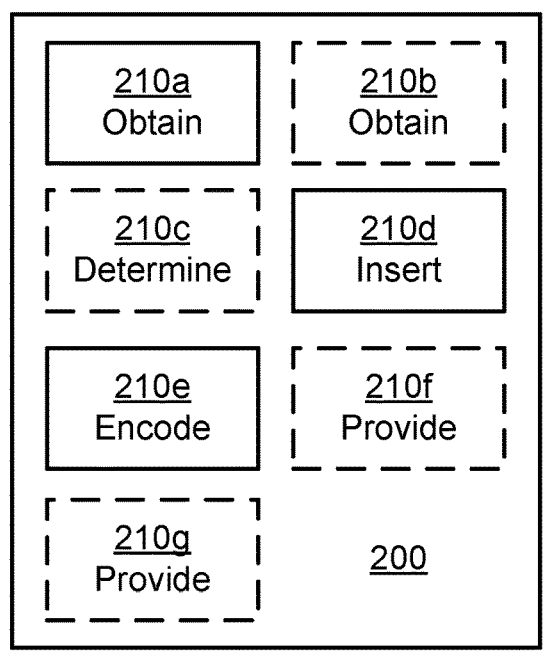
FIG. 11 is a schematic diagram showing functional modules of an information encoder according to an embodiment.

FIG. 11 schematically illustrates, in terms of a number of functional modules, the components of an information encoder 200 according to an embodiment. The information encoder 200 of FIG. 11 comprises a number of functional modules; an obtain module 210a configured to perform step S102, an insert module 210d configured to perform step S108, and an encode module 210e configured to perform step S110. The information encoder 200 of FIG. 11 may further comprise a number of optional functional modules, such as any of an obtain module 210b configured to perform step S104, a determine module 210c configured to perform step S106, a provide module 210f configured to perform step S112, and a provide module 210g configured to perform step S114.

In general terms, each functional module 210a-210g may be implemented in hardware or in software. Preferably, one or more or all functional modules 210a-210g may be implemented by the processing circuitry 210, possibly in cooperation with functional units 220 and/or 230. The processing circuitry 210 may thus be arranged to from the storage medium 230 fetch instructions as provided by a functional module 210a-210g and to execute these instructions, thereby performing any steps of the information encoder 200 as disclosed herein.

Figure 12:
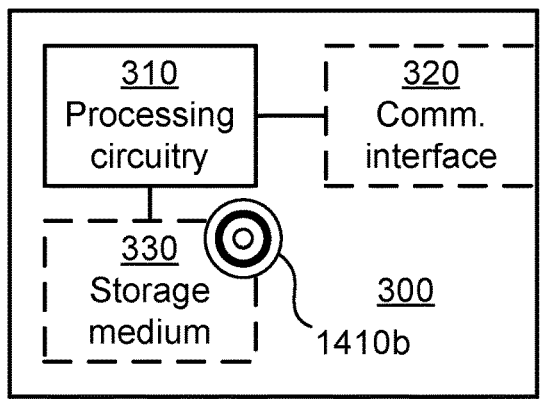
FIG. 12 is a schematic diagram showing functional units of an information decoder according to an embodiment.

FIG. 12 schematically illustrates, in terms of a number of functional units, the components of an information decoder 300 according to an embodiment. Processing circuitry 310 is provided using any combination of one or more of a suitable central processing unit (CPU), multiprocessor, microcontroller, digital signal processor (DSP), etc., capable of executing software instructions stored in a computer program product 1410b (as in FIG. 14), e.g. in the form of a storage medium 330. The processing circuitry 310 may further be provided as at least one application specific integrated circuit (ASIC), or field programmable gate array (FPGA).

Particularly, the processing circuitry 310 is configured to cause the information decoder 300 to perform a set of operations, or steps, S210-S216, as disclosed above. For example, the storage medium 330 may store the set of operations, and the processing circuitry 310 may be configured to retrieve the set of operations from the storage medium 330 to cause the information decoder 300 to perform the set of operations. The set of operations may be provided as a set of executable instructions. Thus the processing circuitry 310 is thereby arranged to execute methods as herein disclosed.

The storage medium 330 may also comprise persistent storage, which, for example, can be any single one or combination of magnetic memory, optical memory, solid state memory or even remotely mounted memory.

The information decoder 300 may further comprise a communications interface 320 for communications at least with an information encoder 200.

As such the communications interface 320 may comprise one or more transmitters and receivers, comprising analogue and digital components and a suitable number of antennas for wireless communications and ports for wireline communications.

The processing circuitry 310 controls the general operation of the information decoder 300 e.g. by sending data and control signals to the communications interface 320 and the storage medium 330, by receiving data and reports from the communications interface 320, and by retrieving data and instructions from the storage medium 330. Other components, as well as the related functionality, of the information decoder 300 are omitted in order not to obscure the concepts presented herein.

Figure 13:
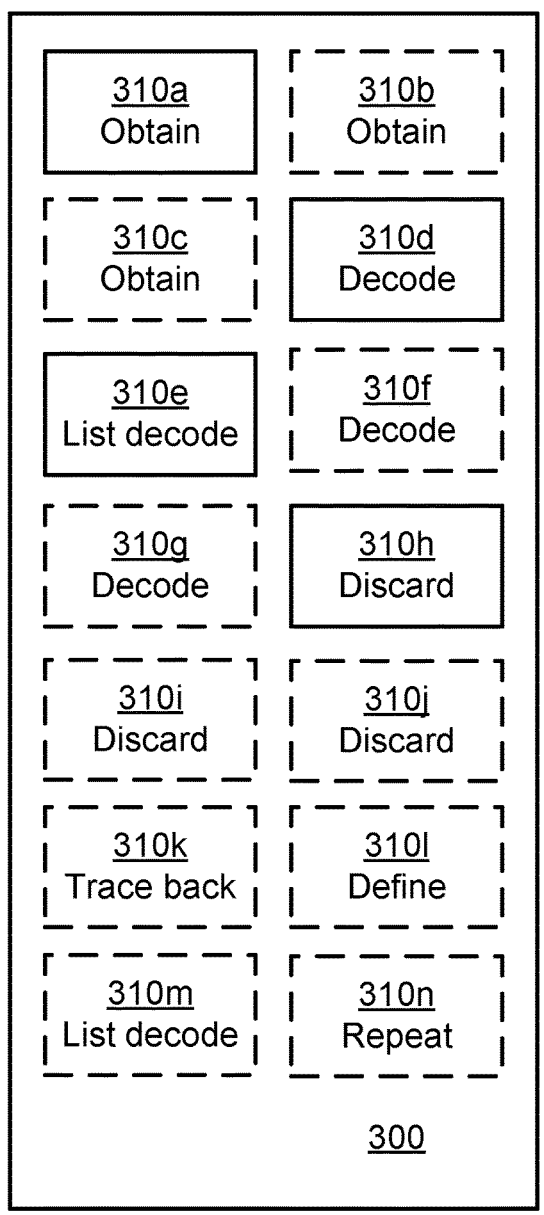
FIG. 13 is a schematic diagram showing functional modules of an information decoder according to an embodiment.

FIG. 13 schematically illustrates, in terms of a number of functional modules, the components of an information decoder 300 according to an embodiment. The information decoder 300 of FIG. 13 comprises a number of functional modules; an obtain module 310a configured to perform step S202, a decode module 310d configured to perform step S208, a list decode module 310e configured to perform step S108a, and a discard module 310h configured to perform step S108b. The information decoder 300 of FIG. 13 may further comprises a number of optional functional modules, such as any of an obtain module 310b configured to perform step S204, an obtain module 310c configured to perform step S206, a decode module 310f configured to perform step S208aa, a decode module 310g configured to perform step S208ab, a discard module 310i configured to perform step S208ba, a discard module 310j configured to perform step S208bb, a trace back module 310k configured to perform step S210, a define module 310l configured to perform step S212, a list decode module 310m configured to perform step S214, an a repeat module 310n configured to perform step S216.

In general terms, each functional module 310a-310n may be implemented in hardware or in software. Preferably, one or more or all functional modules 310a-310n may be implemented by the processing circuitry 310, possibly in cooperation with functional units 320 and/or 330. The processing circuitry 310 may thus be arranged to from the storage medium 330 fetch instructions as provided by a functional module 310a-310n and to execute these instructions, thereby performing any steps of the information decoder 300 as disclosed herein.

The information encoder 200 and/or information decoder 300 may be provided as a standalone device or as a part of at least one further device. For example, the information encoder 200 and/or information decoder 300 may be provided in a radio access network node (such as in a radio base station, a base transceiver station, a node B, or an evolved node B) or in an end-user device (such as in a portable wireless device, a mobile station, a mobile phone, a handset, a wireless local loop phone, a user equipment (UE), a smartphone, a laptop computer, a tablet computer, a sensor device, an Internet of Things device, or a wireless modem).

Alternatively, functionality of the information encoder 200 may be distributed between at least two devices, or nodes. Thus, a first portion of the instructions performed by the information encoder 200 and/or information decoder 300 may be executed in a first device, and a second portion of the of the instructions performed by the information encoder 200 and/or information decoder 300 may be executed in a second device; the herein disclosed embodiments are not limited to any particular number of devices on which the instructions performed by the information encoder 200 and/or information decoder 300 may be executed. Hence, the methods according to the herein disclosed embodiments are suitable to be performed by an information encoder 200 and/or information decoder 300 residing in a cloud computational environment. Therefore, although a single processing circuitry 210, 310 is illustrated in FIGS. 10 and 12 the processing circuitry 210, 310 may be distributed among a plurality of devices, or nodes. The same applies to the functional modules 210a-210g, 310a-310n of FIGS. 10 and 12 and the computer programs 1420a, 1420b of FIG. 14 (see below).

Figure 14:
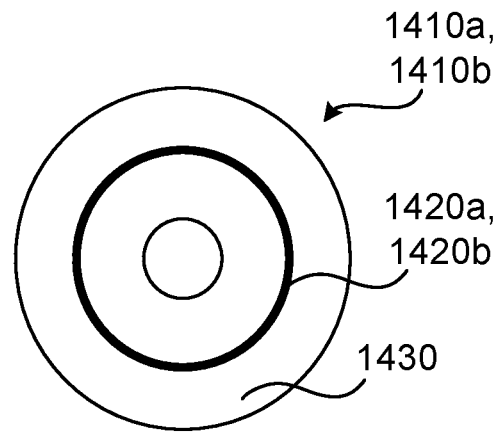
FIG. 14 shows one example of a computer program product comprising computer readable means according to an embodiment.

FIG. 14 shows one example of a computer program product 1410a, 1410b comprising computer readable means 1430o. On this computer readable means 1430, a computer program 1420a can be stored, which computer program 1420a can cause the processing circuitry 210 and thereto operatively coupled entities and devices, such as the communications interface 220 and the storage medium 230, to execute methods according to embodiments described herein. The computer program 1420a and/or computer program product 1410a may thus provide means for performing any steps of the information encoder 200 as herein disclosed. On this computer readable means 1430, a computer program 1420b can be stored, which computer program 1420b can cause the processing circuitry 310 and thereto operatively coupled entities and devices, such as the communications interface 320 and the storage medium 330, to execute methods according to embodiments described herein. The computer program 1420b and/or computer program product 1410b may thus provide means for performing any steps of the information decoder 300 as herein disclosed.

In the example of FIG. 14, the computer program product 1410a, 1410b is illustrated as an optical disc, such as a CD (compact disc) or a DVD (digital versatile disc) or a Blu-Ray disc. The computer program product 1410a, 1410b could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 1420a, 1420b is here schematically shown as a track on the depicted optical disk, the computer program 1420a, 1420b can be stored in any way which is suitable for the computer program product 1410a, 1410b.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A method for encoding an information sequence into an encoded sequence, the method being performed by an information encoder, the method comprising:
   obtaining the information sequence, wherein the information sequence includes a plurality of bits and has a beginning portion and an end portion;
   inserting a plurality of checkpoint sequences in the information sequence, each checkpoint sequence in the plurality of checkpoint sequences comprising at least one bit, wherein a larger number of checkpoint sequences from the plurality of checkpoint sequences are inserted between bits in the beginning portion than in the end portion; and
   encoding the information sequence comprising the plurality of checkpoint sequences into the encoded sequence using a polar code.

2. The method according to claim 1, further comprising:
   providing information identifying locations of the plurality of checkpoint sequences in the information sequence.

3. The method according to claim 1, further comprising:
   providing information identifying lengths of the plurality of checkpoint sequences.

4. The method according to claim 1, further comprising:
   obtaining an indication of computational effort needed by an information decoder for decoding the encoded sequence into the information sequence; and
   determining how many of the plurality of checkpoint sequences to insert in the information sequence based on the indication of computational effort.

5. A method for decoding an encoded sequence, the method being performed by an information decoder, the method comprising:
   obtaining an encoded sequence that encodes an information sequence, wherein the information sequence includes a plurality of bits and comprises a plurality of checkpoint sequences, each checkpoint sequence in the plurality of checkpoint sequences comprising at least one bit, wherein a larger number of checkpoint sequences from the plurality of checkpoint sequences are inserted between bits in a beginning portion of the information sequence than in an end portion of the information sequence; and decoding the encoded sequence using a polar code and the plurality of checkpoint sequences, to obtain the information sequence, by:
performing list decoding of the encoded sequence using one of the plurality of checkpoint sequences, the list decoding of the encoded sequence resulting in at least two candidate decoded sequences; and
discarding those of the at least two candidate decoded sequences whose list decoding of the one of the plurality of checkpoint sequences fails.

6. The method according to claim 5, wherein said performing comprises decoding the encoded sequence until a first of said plurality of checkpoint sequences has been decoded, the decoding resulting in the at least two candidate decoded sequences, each of the at least two candidate decoded sequences being associated with a probability of having correctly decoded said first checkpoint sequence; and wherein said discarding comprises discarding all of the at least two candidate decoded sequences having a probability of having correctly decoded said first checkpoint sequence below a threshold value.

7. The method according to claim 6, wherein said decoding further comprises:
continuing to perform list decoding of the encoded sequence until a second of said plurality of checkpoint sequences has been decoded, the decoding resulting in at least two further candidate decoded sequences, each associated with a further probability of having correctly decoded said second checkpoint sequence; and
discarding all of the at least two further candidate decoded sequences having a probability of having correctly decoded said second checkpoint sequence below the threshold value.

8. The method according to claim 6, wherein said decoding further comprises repeating list decoding and discarding for all of the plurality of checkpoint sequences and until the complete encoded sequence has been decoded, resulting in one single decoded sequence, the single decoded sequence defining the information sequence.

9. The method according to claim 5, wherein the at least two candidate decoded sequences are a result of branching the decoded sequences into the at least two candidate decoded sequences during the list decoding of the encoded sequence, wherein said branching is caused by a binary digit of the decoded sequences having an equal probability of being decoded into a zero and a one during the list decoding of the encoded sequence, and wherein when all of the at least two candidate decoded sequences are discarded, the method further comprises:
tracing back the list decoding to a most recently successfully decoded checkpoint sequence in the decoded sequence;
defining as a decoded sequence another of the at least two candidate decoded sequences that has been successfully decoded at said most recently successfully decoded checkpoint sequence; and
continuing the list decoding from said most recently successfully decoded checkpoint sequence and using said decoded sequence.

10. The method according to claim 5, further comprising:
obtaining information identifying locations of the plurality of checkpoint sequences in the information sequence.

11. The method according to claim 5, further comprising:
obtaining information identifying lengths of the plurality of checkpoint sequences.

12. The method according to claim 5, wherein each of the plurality of checkpoint sequences is defined by a check sum of a cyclic redundancy check, an Internet Protocol address, a header, a sub-header, at least one reserved bit in a Radio Link Control Protocol Data Unit, or a at least one extension bit in the Radio Link Control Protocol Data Unit.

13. An information encoder for encoding an information sequence into an encoded sequence, the information encoder comprising processing circuitry, the processing circuitry being configured to cause the information encoder to:
obtain the information sequence, wherein the information sequence includes a plurality of bits and has a beginning portion and an end portion;
insert a plurality of checkpoint sequences in the information sequence, each checkpoint sequence in the plurality of checkpoint sequences comprising at least one bit, wherein a larger number of checkpoint sequences from the plurality of checkpoint sequences are inserted between bits in the beginning portion than in the end portion; and
encode the information sequence comprising the plurality of checkpoint sequences into the encoded sequence using a polar code.

14. The information encoder according to claim 13, the processing circuitry being further configured to cause the information encoder to provide information identifying locations of the plurality of checkpoint sequences in the information sequence.

15. The information encoder according to claim 13, the processing circuitry being further configured to cause the information encoder to:
provide information identifying lengths of the plurality of checkpoint sequences.

16. The information encoder according to claim 13, the processing circuitry being further configured to cause the information encoder to:
obtain an indication of computational effort needed by an information decoder for decoding the encoded sequence into the information sequence; and
determine how many of the plurality of checkpoint sequences to insert in the information sequence based on the indication of computational effort.

17. An information decoder for decoding an encoded sequence into an information sequence, the information decoder comprising processing circuitry, the processing circuitry being configured to cause the information decoder to:
obtain an encoded sequence that encodes an information sequence, wherein the information sequence includes a plurality of bits and comprises a plurality of checkpoint sequences, each checkpoint sequence in the plurality of checkpoint sequences comprising at least one bit, wherein a larger number of checkpoint sequences from the plurality of checkpoint sequences are inserted between bits in a beginning portion of the information sequence than in an end portion of the information sequence; and
decode the encoded sequence using a polar code and the plurality of checkpoint sequences, to obtain the information sequence, by:
performing list decoding of the encoded sequence using one of the plurality of checkpoint sequences, the list decoding of the encoded sequence resulting in at least two candidate decoded sequences; and discarding those of the at least two candidate decoded sequences whose list decoding of the one of the plurality of checkpoint sequences fails.

18. The information decoder according to claim 17, wherein:
the processing circuitry is configured to cause the information decoder to perform said list decoding of the encoded sequence by decoding the encoded sequence until a first of said plurality of checkpoint sequences has been decoded, the decoding resulting in the at least two candidate decoded sequences, each of the at least two candidate decoded sequences being associated with a probability of having correctly decoded said first checkpoint sequence; and
the processing circuitry is configured to cause the information decoder to perform said discarding by discarding all of the at least two candidate decoded sequences having a probability of having correctly decoded said first checkpoint sequence below a threshold value.

19. The information decoder according to claim 18, the processing circuitry is configured to cause the information decoder to decode the encoded sequence further by:
continuing to perform list decoding of the encoded sequence until a second of said plurality of checkpoint sequences has been decoded, the decoding resulting in at least two further candidate decoded sequences, each associated with a further probability of having correctly decoded said second checkpoint sequence; and
discarding all of the at least two further candidate decoded sequences having a probability of having correctly decoded said second checkpoint sequence below the threshold value.

20. The information decoder according to claim 19, the processing circuitry is configured to cause the information decoder to decode the encoded sequence further by repeating list decoding and discarding for all of the plurality of checkpoint sequences and until the complete encoded sequence has been decoded, resulting in one single decoded sequence, the single decoded sequence defining the information sequence.

21. The information decoder according to claim 17, wherein the at least two candidate decoded sequences are a result of branching the decoded sequences into the at least two candidate decoded sequences during the list decoding of the encoded sequence, wherein said branching is caused by a binary digit of the decoded sequences having an equal probability of being decoded into a zero and a one during the list decoding of the encoded sequence, and wherein when all of the at least two candidate decoded sequences are discarded, the processing circuitry is configured to cause the information decoder to:
trace back the list decoding to a most recently successfully decoded checkpoint sequence in the decoded sequence;
define as a decoded sequence another of the at least two candidate decoded sequences that has been successfully decoded at said most recently successfully decoded checkpoint sequence; and
continue the list decoding from said most recently successfully decoded checkpoint sequence and using said decoded sequence.

22. The information decoder according to claim 17, the processing circuitry being further configured to cause the information decoder to obtain information identifying locations of the plurality of checkpoint sequences in the information sequence.

23. The information decoder according to claim 17, the processing circuitry being further configured to cause the information decoder to obtain information identifying lengths of the plurality of checkpoint sequences.

24. The information decoder according to claim 17, wherein each of the plurality of checkpoint sequences is defined by a check sum of a cyclic redundancy check, an Internet Protocol address, a header, a sub-header, at least one reserved bit in a Radio Link Control Protocol Data Unit, or a at least one extension bit in the Radio Link Control Protocol Data Unit.

25. A user equipment comprising an information encoder for encoding an information sequence into an encoded sequence, the information encoder comprising processing circuitry, the processing circuitry being configured to cause the information encoder to:
obtain the information sequence, wherein the information sequence includes a plurality of bits and has a beginning portion and an end portion;
insert a plurality of checkpoint sequences in the information sequence, each checkpoint sequence in the plurality of checkpoint sequences comprising at least one bit, wherein a larger number of checkpoint sequences from the plurality of checkpoint sequences are inserted between bits in the beginning portion than in the end portion; and
encode the information sequence comprising the plurality of checkpoint sequences into the encoded sequence using a polar code.

26. A base station comprising an information decoder for decoding an encoded sequence into an information sequence, the information decoder comprising processing circuitry, the processing circuitry being configured to cause the information decoder to:
obtain an encoded sequence that encodes an information sequence, wherein the information sequence includes a plurality of bits and comprises a plurality of checkpoint sequences, each checkpoint sequence in the plurality of checkpoint sequences comprising at least one bit, wherein a larger number of checkpoint sequences from the plurality of checkpoint sequences are inserted between bits in a beginning portion of the information sequence than in an end portion of the information sequence; and
decode the encoded sequence using a polar code and the plurality of checkpoint sequences, to obtain the information sequence, by:
performing list decoding of the encoded sequence using one of the plurality of checkpoint sequences, the list decoding of the encoded sequence resulting in at least two candidate decoded sequences; and
discarding those of the at least two candidate decoded sequences whose list decoding of the one of the plurality of checkpoint sequences fails.

* * * * *